(12) United States Patent
Kirmser et al.

(10) Patent No.: US 7,720,645 B2
(45) Date of Patent: May 18, 2010

(54) TEST APPARATUS FOR DIGITIZED TEST RESPONSES, METHOD FOR TESTING SEMICONDUCTOR DEVICES AND DIAGNOSIS METHOD FOR A SEMICONDUCTOR DEVICE

(75) Inventors: Stephane Kirmser, Munich (DE); Heinz Mattes, Munich (DE); Sebastian Sattler, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/534,005

(22) Filed: Sep. 21, 2006

(65) Prior Publication Data

US 2007/0089010 A1    Apr. 19, 2007

(30) Foreign Application Priority Data

Sep. 21, 2005    (DE) .................. 10 2005 045 183

(51) Int. Cl.
    *G01R 31/28*    (2006.01)
(52) U.S. Cl. ..................................... 702/189
(58) Field of Classification Search .................. 702/189
    See application file for complete search history.

(56) References Cited

U.S. PATENT DOCUMENTS

| | | | | |
|---|---|---|---|---|
| 6,198,353 | B1* | 3/2001 | Janesch et al. ................. | 331/16 |
| 6,493,396 | B1* | 12/2002 | Nguyen et al. ............... | 375/279 |
| 2002/0062200 | A1 | 5/2002 | Mori et al. ................... | 702/120 |
| 2006/0067293 | A1* | 3/2006 | Santhoff et al. ............. | 370/347 |

FOREIGN PATENT DOCUMENTS

| | | |
|---|---|---|
| DE | 10145152 A1 | 6/2002 |
| EP | 0052048 B1 | 2/1987 |

OTHER PUBLICATIONS

Analog Devices, A Technical Tutorial on Digital Signal Synthesis, 1999, p. 1-122.*
http://www.merriam-webster.com/dictionary/test, p. 1, Oct. 14, 2008.*
Tierney J., et al., "A Digital Frequency Synthesizer"; 1971 IEEE Transaction on Audio and Electroacoustics, vol. AU-19, No. 1, pp. 324-332, Mar. 1971.
Beauchamp K., "Applications of Walsh and related functions", pp. 8-18, 1984.
"Direct Digital Synthesis" aus Wikipedia, der freien Enzyklopadie, (w/english translation), http://de.wiltipedia.org, 6 pages, Printed Jul. 27, 2005.

* cited by examiner

*Primary Examiner*—Tung S Lau
(74) *Attorney, Agent, or Firm*—Banner & Witcoff, Ltd.

(57) ABSTRACT

A test apparatus for testing digitized test responses has a generator and a signal extractor. The generator uses direct digital synthesis to generate a set of n digital reference signals which are orthogonal to one another. In this case, n is a natural number greater than 1. The signal extractor contains a test input and reference inputs. The test input receives a digitized test response and the reference inputs are connected to the reference signals which are generated by the generator. The signal extractor generates scalar products from a respective reference signal and the test response and uses the products to calculate whether a combination of reference signals is contained in the test response.

9 Claims, 8 Drawing Sheets

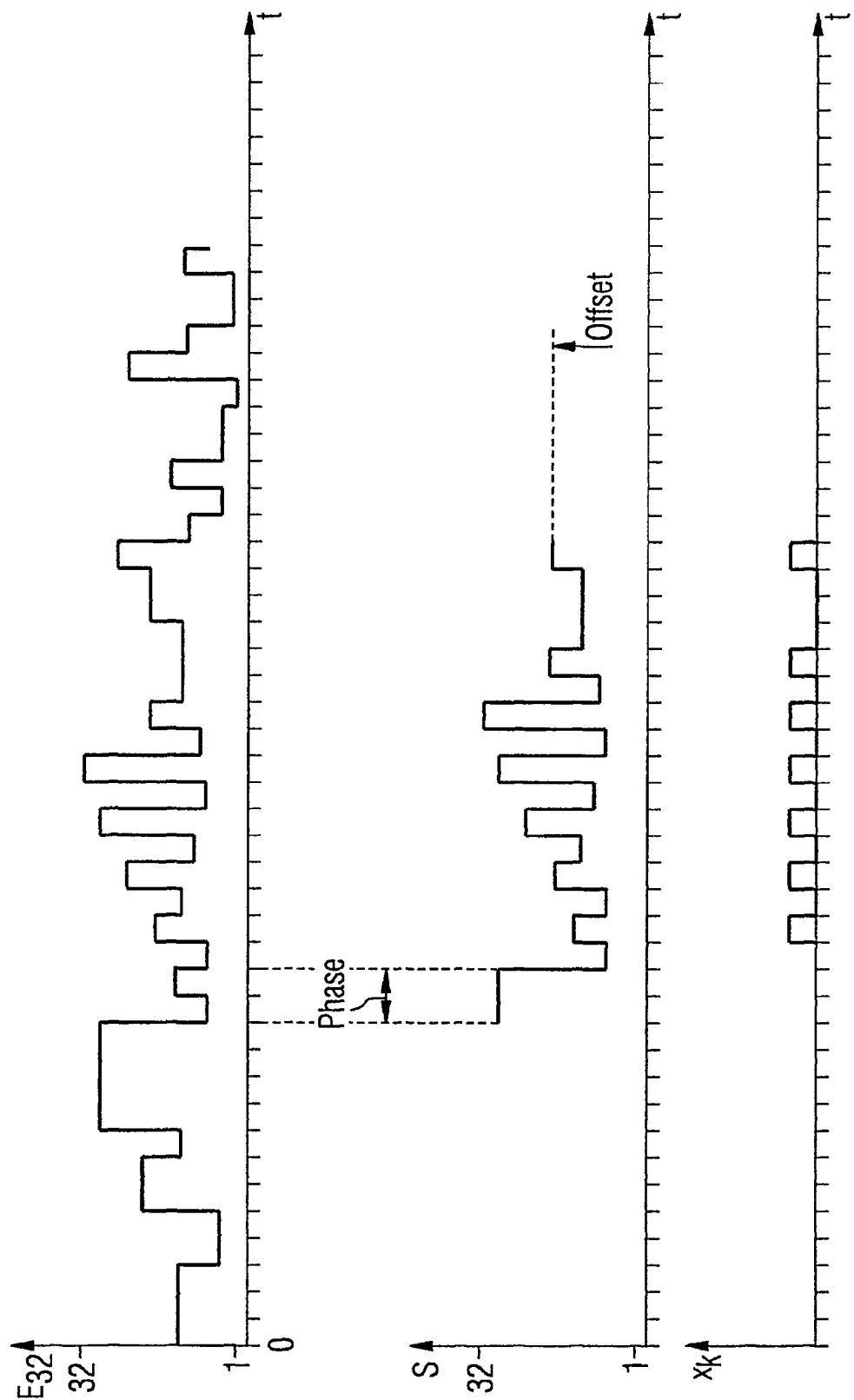

TEST APPARATUS FOR DIGITIZED TEST RESPONSES, METHOD FOR TESTING SEMICONDUCTOR DEVICES AND DIAGNOSIS METHOD FOR A SEMICONDUCTOR DEVICE

PRIORITY

This application claims priority from German Patent Application No. DE 10 2005 045 183.7, which was filed on Sep. 21, 2005, and is incorporated herein by reference in its entirety.

TECHNICAL FIELD

The invention relates to a test apparatus for digitized test responses, to a method for testing semiconductor devices and to a diagnosis method for a semiconductor device.

BACKGROUND

Semiconductor devices which output digitized signals are, for example, analog/digital converters (AD converters). A digitized signal is understood as meaning a signal which was generated by digitizing analog signals and which is a digital signal having multiple values.

A Fast Fourier Transformation (FFT) is often used when testing AD converters, as described in IEEE Std 1241-2000. The FFT is also used when testing semiconductor devices which output analog signals as a test response. In this case, the analog test response is digitized before evaluation by means of an FFT.

In an FFT, all spectral components of a signal are calculated at the same time. In a normal FFT with 4096 points, 4096 spectral components are calculated even if, for example, only 10 spectral components from a fundamental tone and nine harmonics are requested. This signifies unnecessary computation complexity which increases the test costs. The spectral components are determined from the FFT during isolated subsequent processing and not while the test response is being received.

One difficulty when starting production of a semiconductor device which outputs analog or digitized test responses is that the test response comprises a large volume of data. During the production test, the test responses are assessed only to determine whether or not the semiconductor device satisfies the test requirements. When production of a semiconductor device is started for the first time, it is not yet known which errors will cause failures. If a semiconductor device fails, test passes will thus be carried out once again in an analysis laboratory in order to find the cause of the error and thus to diagnose the semiconductor device. The data which are obtained during this first test, the production test, cannot be used for the diagnosis since the volume of data is too large to store.

SUMMARY

A test apparatus can be used to test a digitized test response without unnecessary computation complexity. A test apparatus for testing digitized test responses, may comprise a generator which uses direct digital synthesis to generate a set of n digital reference signals which are orthogonal to one another, n being a natural number greater than 1, a signal extractor which contains a test input and a plurality of reference inputs, wherein the test input receives a digitized test response and the reference inputs are connected to the reference signals which are generated by the generator, and wherein the signal extractor generates scalar products from a respective reference signal and the test response and uses said products to calculate whether a combination of the reference signals is contained in the test response.

BRIEF DESCRIPTION OF THE DRAWINGS

The invention is illustrated in more detail in the drawings using an embodiment.

FIG. 9 illustrates signal profiles of signals within a test apparatus according to an embodiment.

DETAILED DESCRIPTION

Figure 1:
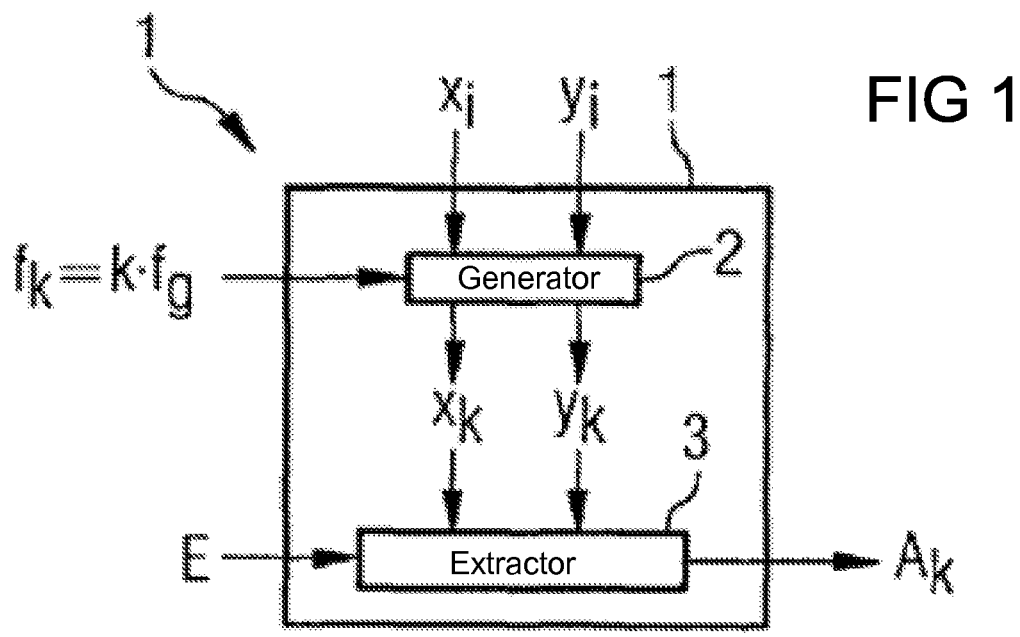
FIG. 1 shows a test apparatus according to an embodiment with signal extraction.

A test apparatus for testing digitized test responses is provided. Test responses are output by semiconductor devices if the semiconductor devices are operated in a test and voltages are applied to inputs of the semiconductor devices. The test apparatus contains a generator and a signal extractor. The generator generates a set of digital reference signals which are orthogonal to one another. The number of signals belonging to the set is n, n being a natural number greater than 1.

Orthogonality of two digital signals x and y means that the following applies to the sample values $x_1$ to $x_N$ and $y_1$ to $y_N$:

$$\sum_{j=1}^{N} x_i y_i = 0.$$

For a set of orthogonal signals, this condition $$\sum_{j=1}^{N} x_i y_i = 0$$

is satisfied for all signals x and y of this set if $x \neq y$.

During digital direct synthesis, digital signal values are generated and/or stored in a memory and are sequentially output on the basis of an input signal, for example a clock signal.

The signal extractor may have a test input and a plurality of reference inputs. The signal extractor may receive the test response at its test input and may receive the reference signals, which are provided by the generator, at its reference inputs. The test response received by the signal extractor may also be modified. Modification can be effected, for example, by feeding only a temporal excerpt of the data, which is provided by the semiconductor device to be tested, to the signal extractor. It is also possible for the signal values which are provided by the semiconductor device to be multiplied by a constant number or be added to a constant number.

The signal extractor may calculate scalar products from the test response and the reference signals and output, at its test output, values which indicate whether the combinations of the reference signals are contained in the test response. The combinations may be linear combinations of the reference signals. However, the combinations may also comprise other functions such as root functions or quadratic functions of the reference signals.

The scalar product (also referred to as an internal product) of two digital signals x and e can be defined as $$\sum_{j=1}^{N} x_i e_i,$$

where $x_i$ and $e_i$ are sample values of the signals x and e.

The test apparatus may advantageously make it possible to assess the test response using a limited number of reference signals. To this end, only those reference signals which are required for the evaluation need to be generated. The simulation of the semiconductor device often reveals which test responses will be output by the semiconductor device if no error has occurred. The reference signals may accordingly be adapted in such a manner that no unnecessary calculations are carried out.

The function of the expected test response can be broken down into a combination of orthogonal functions. The orthogonal functions can be emulated by the reference signals. However, the functions for possible erroneous test responses may also be broken down into a combination of the orthogonal functions and compared with the test response using the signal extractor.

The test apparatus preferably may contain a correction circuit having a correction memory. The correction values for the digital synthesis can be stored in the correction memory.

In another embodiment, the signal extractor may output the phase, the offset and the amplitude. The amplitude describes whether the signal contained in the test response has expanded in comparison with the reference signal. This is the case if the signal values of the reference signal are each a multiple or a fraction of the signal values of the test response.

The phase states whether the signal contained in the test response has been shifted, in terms of time, with respect to the reference signal. The offset describes a shift in the reference line of the test response with respect to the reference line of the reference signal. This is the case if, for example, the values of the reference signal are each equal to the values of the reference signal plus 2.

Providing these output values may make it possible to rapidly assess the results. Complicated post-processing, that is to say subsequent processing after the test, is not necessary.

In one embodiment, the generator may receive a clock signal and uses the clock signal to read out the values, which are stored in the generator, as a reference signal. Storing the reference signal values makes it possible for them to be read out quickly. The generator can thus also provide reference signals which are at a high frequency.

The test apparatus may be extended in such a manner that it has a multiplicity of generators and a multiplicity of signal extractors. The generators each may generate a set of n reference signals. All of the reference signals of a set can be orthogonal to one another.

The signal generators each may receive a set from the multiplicity of reference signals at their reference inputs. The test response can be applied to the test input of each signal generator. Each signal generator may form the scalar products from the test response and the reference signals. It may output values which indicate the extent to which the received reference signals match the received test response.

Providing a plurality of generators and a plurality of signal extractors may make it possible to simultaneously extract using different sets of reference signals. This saves test time in comparison with sequential evaluation.

In order to operate the generators, provision can be made of a frequency divider which receives an input clock and uses it to generate and output a multiplicity of clock signals. The clock signals generated have clock periods which are multiples of the periods of the input clock.

The test apparatus can be implemented in a BIST (Built-In Self-Test) or BOST (Built-Off Self-Test). As a result, the steps needed for a test can take place in an automated manner, thus reducing the control complexity for the test.

A set of orthogonal reference signals preferably may comprise fewer than 33 signals. The small number of reference signals reduces the complexity for calculating the scalar products and storing the results. The set preferably may contain fewer than 17, preferably fewer than 8, reference signals.

According to an embodiment, in a method for testing digitized test responses, in a first step, a set of n orthogonal digital reference signals can be generated using direct digital synthesis. In this case, n can be a natural number greater than 1.

A scalar product can be formed from a respective reference signal and a test response in order to check whether the test response and the reference signal match. Values which specify the extent to which a combination of reference signals is contained in the test response can then be output.

The reference signals generated may be preferably corrected using a correction memory. To this end, a value which is stored in the correction memory can be added to the value of the reference signal, for example.

During the direct synthesis, a clock signal can be preferably received and this clock signal can be used to output stored values. These values which have been read out are then read out as reference signals.

In one embodiment, a plurality of sets of reference signals can be generated and the scalar products of the test responses can be simultaneously formed together with the reference signals for a plurality of sets. This can reduce the test time.

In an embodiment, in a method for diagnosing semiconductor devices which output analog or digitized test responses, during the start of production, the semiconductor device can be operated in a test. The test response which is then output by the semiconductor device can be received and evaluated. If the semiconductor device outputs an analog test response, this can be first of all digitized using an analog/digital converter.

Evaluation can be effected using the above-mentioned steps of generating a set of orthogonal digital reference signals, forming scalar products and outputting values which specify the extent to which the test response is contained in the reference signals.

The results obtained in the process are, on the one hand, can be stored on a data storage medium and, on the other hand, can be compared with expected values. If an error has occurred during this comparison, the cause of the error can be analyzed by assessing the stored results. Diagnosis investigates what the causes of errors can be attributed to. In the method according to an embodiment, only a small volume of data needs to be stored since the test response has already been compressed by the signal extraction. Particularly in the case of digitized test responses, the volume of data can be normally so large that storage would be very complicated.

The stored data can be used during the analysis and a further test pass in an analysis laboratory, possibly using other analysis testers, can be avoided.

The number n (the number of reference signals) can be preferably selected to be n≦32 in order to keep the calculation complexity in the signal extractor low.

In an embodiment, a computer program may run in a test apparatus and may be intended to carry out a method for testing an electrical circuit, the computer program being designed in such a manner that the preceding method steps can be carried out. The computer program may contain, for example, instructions for driving or initializing the generator, the frequency divider or the signal extractor. The computer program may be contained in a storage medium, in particular in a computer memory or in a random access memory or may be transmitted in an electrical carrier signal.

It goes without saying that an embodiment also comprises a method in which a computer program according to an embodiment is downloaded from an electronic data network, for example from the Internet, onto a computer that is connected to the data network.

FIG. 1 shows a test apparatus according to an embodiment with signal extraction. The test apparatus 1 contains a generator 2 and a signal extractor 3. The generator 2 receives the starting values $x_i$ and $y_i$ and a clock signal $f_k=k*f_g$, the clock signal $f_k$ being at a frequency $f_k$ that is a k multiple of the fundamental frequency $f_g$. The generator 2 outputs the reference signals $x_k$ and $y_k$ which are supplied to an input of the signal extractor 3. The signals $x_k$ and $y_k$ are, for example, signals of the form $$x_k = \cos\left(\frac{2\pi n}{N}\right)$$

$$y_k = \sin\left(\frac{2\pi n}{N}\right)$$

where $n \in [0, 1, 2, \ldots, M]$ and $M, N \in N_0$.

However, the signals need not be harmonic or trigonometric functions but may also emulate non-harmonic digital functions.

The signal extractor 3 also receives the digitized test response E and outputs the output signal $A_k$. In this case, the output signal $A_k$ provides information regarding the match, the amplitude, the phase and the offset.

In this case, the match describes whether the test response E contains the reference signal $x_k$, $y_k$ or a combination of $x_k$ and $y_k$. The amplitude describes whether the amplitude of the signal contained in the test response has expanded in comparison with the reference signal, that is to say whether the values of the test response or of part of the test response are multiples or parts of the values of the reference signal $x_k$ and $y_k$.

The phase describes the extent to which the signal contained in the test response has been shifted, in terms of time, with respect to the reference signal, and the offset describes the extent to which the reference line of the test response has been shifted with respect to the reference line of the reference signal. In this case, a reference line is a minimum, maximum or average value.

Figure 2:
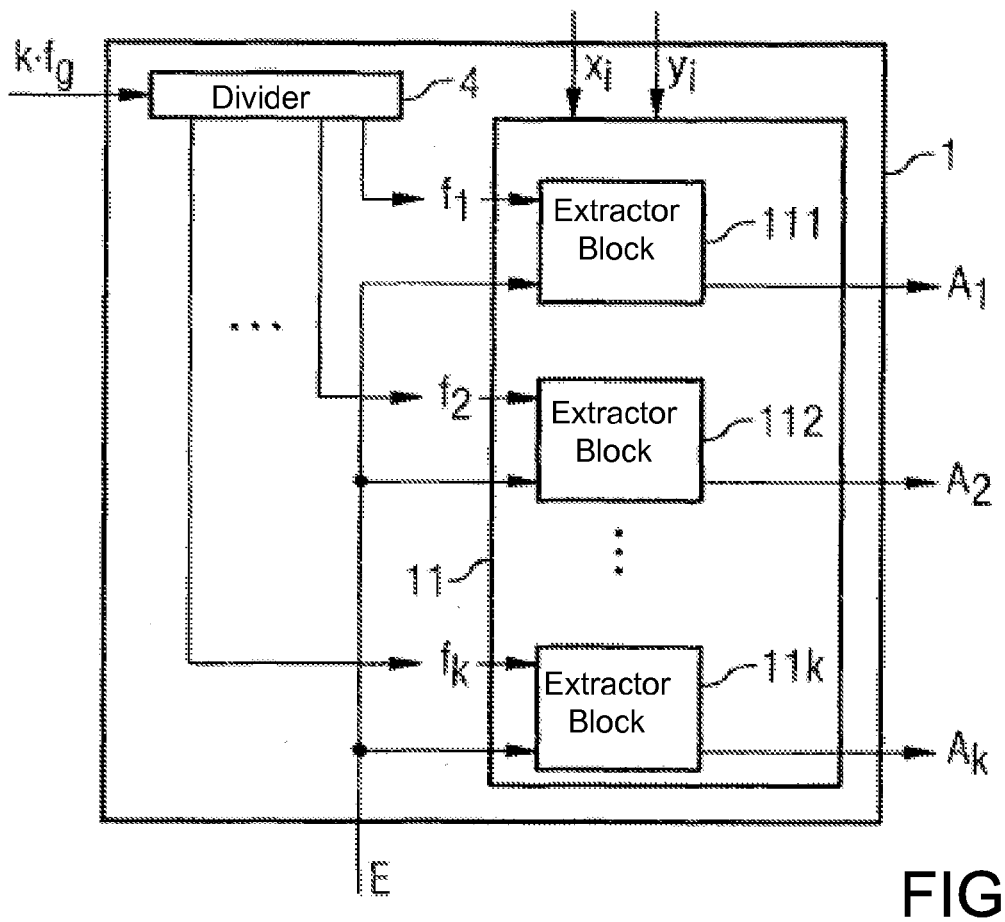
FIG. 2 shows a test apparatus according to an embodiment with parallel signal extraction.

FIG. 2 presents a test apparatus according to an embodiment with parallel signal extraction. The test apparatus 1 contains a frequency divider 4 and a multiextractor 11 which, for its part, comprises the k extractor blocks 111, 112 to 11k. Each of the extractor blocks 111, 112 to 11k has the same structure as the test apparatus 1 from FIG. 1.

The frequency divider 4 receives a clock signal (also referred to as the master clock $k*f_g$) and outputs clock signals $f_1$, $f_2$ to $f_k$ whose frequencies $f_1$, $f_2$ to $f_k$ differ. In this case, $f_1$ is equal to $f_g$, $f_2$ is twice as high as $f_g$ and $f_k$ is equal to $k*f_g$. The frequencies $f_j$ (j from 1 to k−1) are also each equal to j times $f_g$. Each of the extractor blocks 11j receives the starting values $x_i$ and $y_i$ and a clock signal $f_j$. In this case, j runs from 1 to k. The reference signals $x_j$ and $y_j$ are generated by generators 2 within the extractor blocks 11j. k tones are extracted from the test response E using all of the reference signals $x_j$ and $y_j$. The values for the match, the amplitude, the phase and the offset are provided as output values in the output signals [$A_1$, $A_2$, ..., $A_k$].

If there are a plurality of reference signals (also referred to as signals or tones to be extracted), an extractor block must be available for each reference signal. In this case, the extractor blocks may also be used in temporal succession for the different reference signals. This is referred to as sequential evaluation. In contrast, in the embodiment shown in FIG. 2, a multiplicity of reference signals are supplied in a parallel manner, and thus simultaneously, to the extractor blocks 111, 112 to 11k and are evaluated in the latter. Parallel evaluation in the extractor blocks 111 to 11k saves time in comparison with sequential evaluation.

The test apparatus 1 may be combined to form a block. The signals [$A_1$, $A_2$, ..., $A_k$] may be combined to form the signal A which has multiple values. Additionally required digital control signals, for example a system clock or set-up and initialization signals, are also used but are not depicted in FIG. 2.

Figure 3:
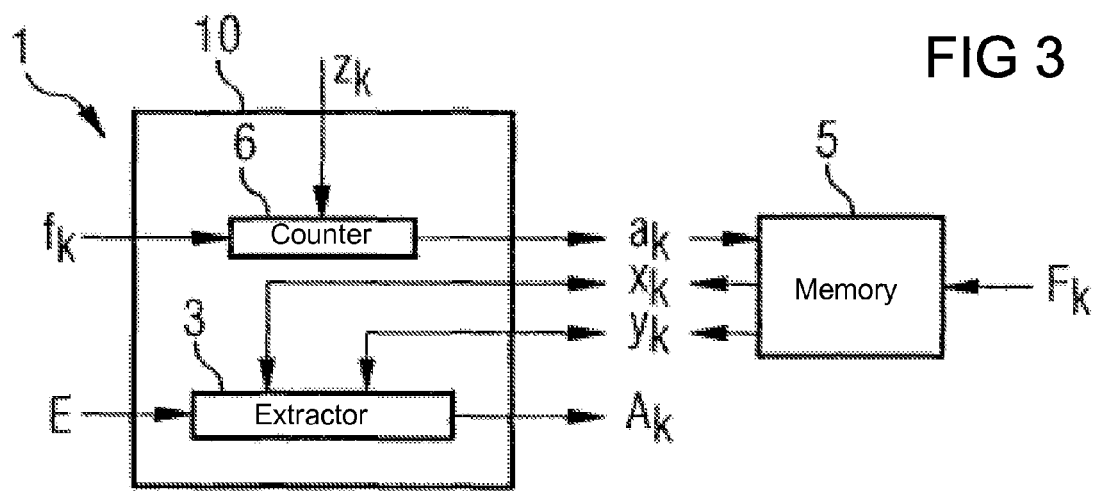
FIG. 3 shows a test apparatus according to an embodiment with details of the generator for reference signals from FIG. 1.

FIG. 3 shows a test apparatus according to an embodiment with details of the generator for reference signals. The test apparatus 1 contains an extraction block 10 and a memory 5. The extraction block 10 has a counter 6 and a signal extractor 3. The counter 6 receives the clock signal $f_k$ and the counter starting value $z_k$. At its output, it outputs the counter reading $a_k$ which is received by the memory 5. The memory 5 also receives the function signal $F_k$ which can be used to write the contents of the memory 5. The memory 5 thus stores the sample values for the reference signals which are output as reference signal values $x_k$ and $y_k$ on the basis of the counter reading $a_k$.

In accordance with the reference signals $x_k$ and $y_k$, the signal extractor 3 extracts the test response E to give an output value $A_k$.

The functionality of the generator 2 in FIG. 1 has been split into a counter 6 and a memory 5. In this case, the function of the generator 2 from FIG. 1, which was implemented using digital logic, is replaced with the counter 6 and the memory 5. The counter 6 provides the counter reading $a_k$ at the sampling rate $f_k$. In this case, the counter reading is incremented by one unit during each counting step. The counter reading $a_k$ is used directly as address space for reading the memory 5. The counter reading of the counter 6 can be initialized using $z_k$ and the memory contents of the memory 5 can be initialized using $F_k$.

Before the beginning of the test, all of the sample values for the reference signals $x_k$ and $y_k$ are loaded into the memory 5 using $F_k$. The counter 6 is preset (initialized) using $z_k$ and provides the addresses for sequentially reading out the digital values $x_k$ and $y_k$ from the memory 5. The output $A_k$ of the signal extractor 3 contains the kth calculated amplitude, phase and offset for the frequency (or for the tone or spectral line) $f_k$. Additionally required digital control signals, for example the system clock, read/write signals for the memory 5 or set-up and initialization signals, are not depicted.

Figure 4:
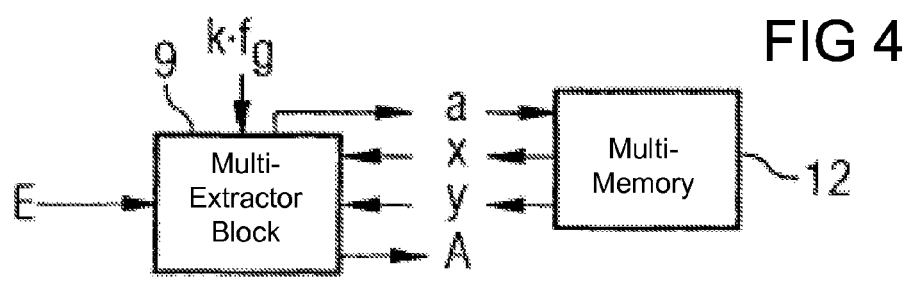
FIG. 4 shows a test apparatus with simultaneously parallel signal extraction.

FIG. 4 shows a test apparatus with simultaneously parallel signal extraction. The test apparatus 1 contains a multiextractor block 9 and a multimemory 12. The multiextractor block 9 receives the test response E, the master clock $k*f_g$ and the reference signals x and y which comprise a multiplicity of reference signals $x_1, x_2, \ldots, x_k$ and $y_1, y_2, \ldots, y_k$. The multiextractor block 9 outputs the counter readings a, which contain the signals $a_1, \ldots, a_k$, and the output values A, which contain the signals $A_1, A_2, A_k$.

Figure 5:
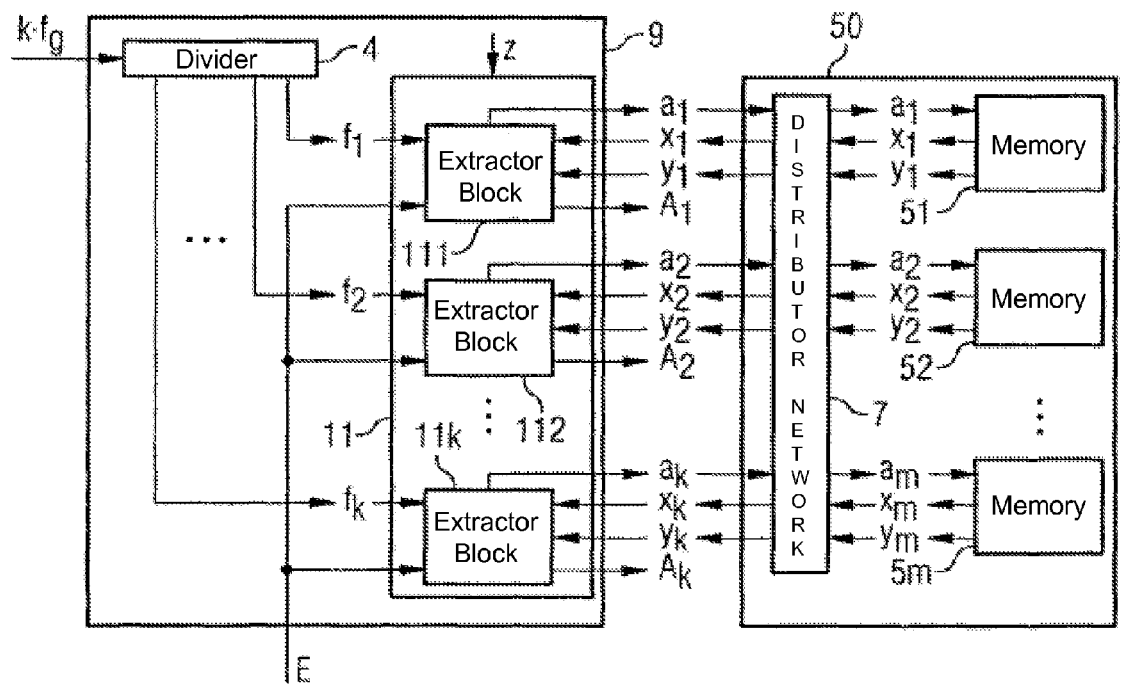
FIG. 5 shows details of the test apparatus according to FIG. 4.

FIG. 5 shows details of the test apparatus according to FIG. 4 with a multiextractor block 9 and a multimemory block 50. The multiextractor block 9 contains a frequency divider 4 and a multiextractor 11. The extractor blocks 11$j$ (where j runs from 1 to k) which are arranged in the multiextractor 11 each receive the clock signal $f_j$ and the reference signals $x_j$ and $y_j$ and each output the counter reading $a_j$ and the output signal $A_j$.

The multimemory block 50 contains a distributor network 7 and the memories 51, 52 to 5$m$. In this case, m is a natural number which may be not equal to k. In this case, the distributor network 7 has the task of respectively distributing the addresses $a=[a_1, a_2, \ldots, a_k]$ and the signals $(x,y)=[(x_1,y_1), (x_2,y_2), \ldots (x_k,y_k)]$ to m addresses and signals for the memories 51, 52 to 5$m$.

The signal extractors 111 to 11$k$ all test the same test response E and are supplied at different sampling rates $f_j$, as in the embodiment in FIG. 2. The reference signals $x_j$ and $y_j$ are output by the respective memories 51, 52 to 5$m$.

Figure 6:
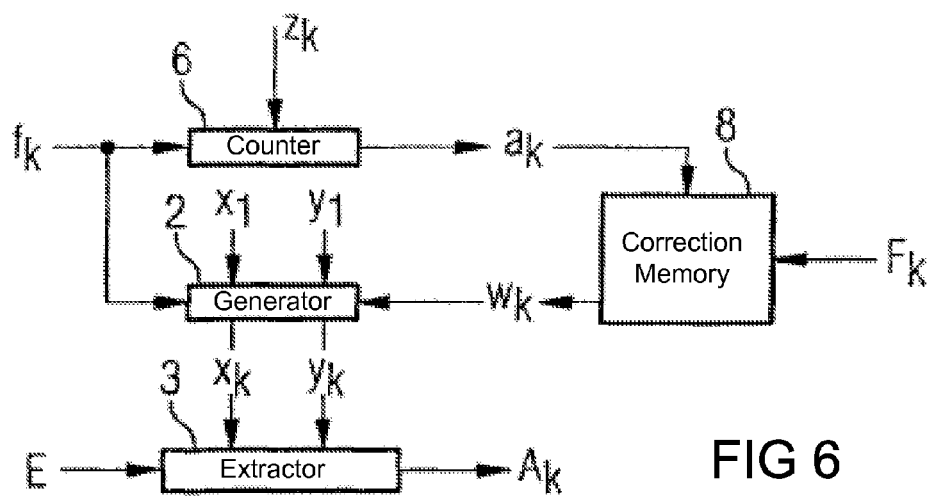
FIG. 6 shows a test apparatus with a correction circuit for reference signals and parallel signal extraction.

FIG. 6 shows a test apparatus according to an embodiment with RAM correction. The test apparatus 1 comprises a counter 6, a correction memory 8, a generator 2 and a signal extractor 3. The counter 6 receives a clock $f_k$ and a starting value $z_k$ and outputs the counter reading $a_k$ which is received by the correction memory 8.

The correction memory 8 provides a correction value $w_k$ for each sample value $(x_k,y_k)$. The generator 2 generates the reference signals $x_k$ and $y_k$ from the clock $f_k$ and the correction value $w_k$. The counter 6 is initialized using the signal $z_k$, the correction memory 8 is initialized using $F_k$ and the generator 2 is initialized using the starting values $x_i$ and $y_i$.

The generator 2 contains an internal function generator in which the signal values for the reference signals $x_k$ and $y_k$ are generated. This function generator can be programmed using an initialization signal that is not depicted in FIG. 5.

Before the beginning of the test, the correction values $w_k$ for the reference signals, which are generated by the generator 2, are loaded into the correction memory 8 using $F_k$. The counter 6 is preset using $z_k$ and provides the addresses for sequentially reading out this digital correction $w_k$ of the reference signal $(x_k, y_k)$ from the correction memory 8.

Figure 7:
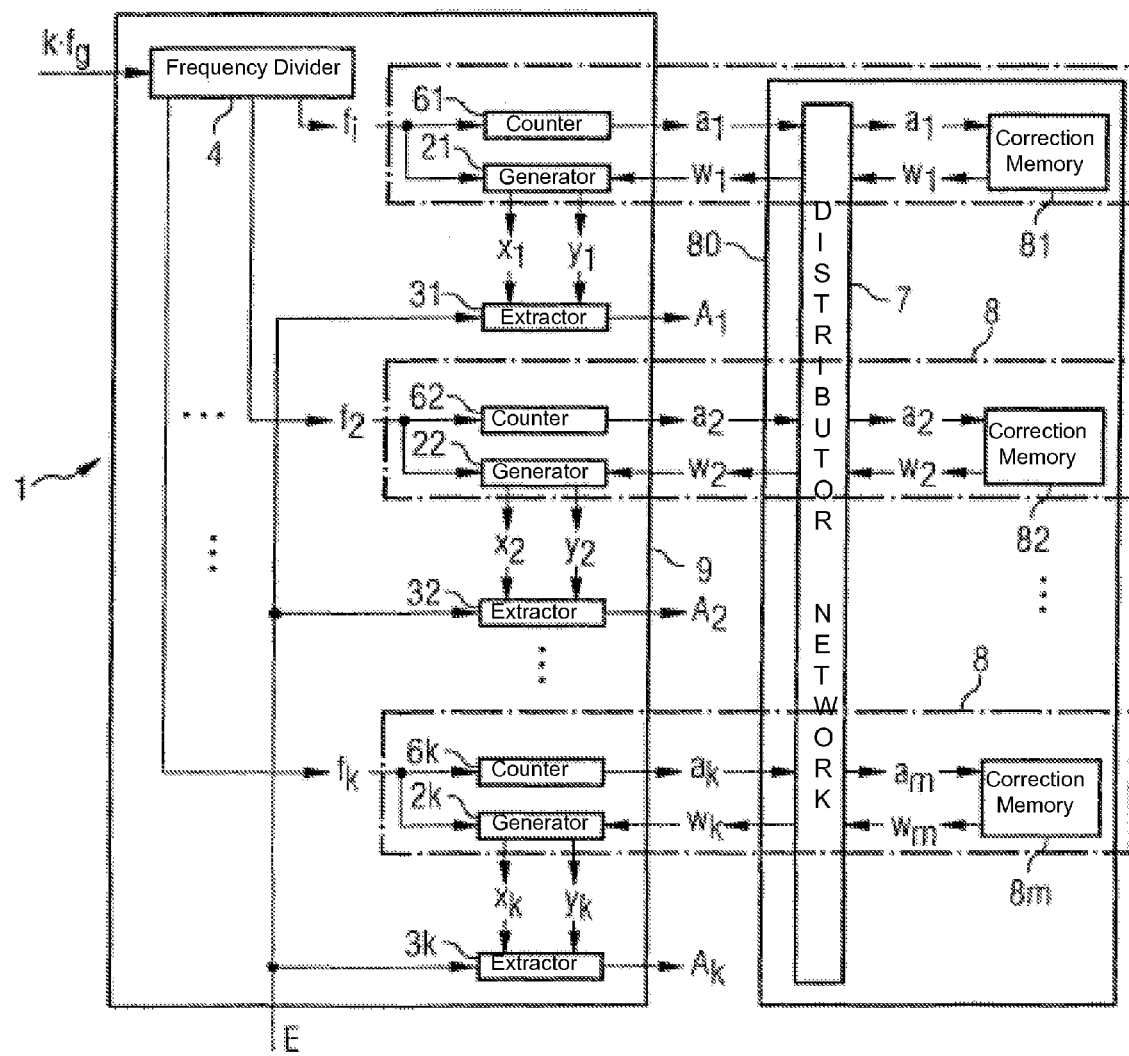
FIG. 7 shows details of the test apparatus according to FIG. 6.

FIG. 7 shows a test apparatus with multisignal extraction using RAM correction. The test apparatus 1 contains a multiextractor block 9 and a multicorrection memory 80. The multiextractor block 9 contains a frequency divider 4, k counters 61 to 6$k$, k generators 21 to 2$k$ and k signal extractors 31 to 3$k$. The multicorrection memory 80 contains a distributor network 7 and m correction memories 81, 82 to 8$m$.

The frequency divider 4 provides the clock signals $f_1, f_2$ to $f_k$. The counters 6$j$ (in this case, j runs from 1 to k) receive the clock signals $f_j$ and output the counter readings $a_j$. The distributor network 7 receives the counter reading $a_j$ and distributes it to one of the correction memories 8$n$. In this case, n is a number between 1 and m. The correction memories 8$n$ output correction values $w_n$ which are supplied to the generators 2$j$ via the distributor network 7. The generators 2$j$ output the reference signals $x_j$ and $y_j$.

Reference generation for a particular reference signal $x_j$, $y_j$ for a particular j can be combined by combining the respective elements counter 6$j$, correction memory 8$j$ and generator 2$j$ to form a block. Alternatively, only the elements counter 6$j$ and generator 2$j$ are combined. All of the counters 6$j$ can also be integrated together in a block. Alternatively, all of the counters 6$j$ and the frequency divider 4 are combined. All of the signal extractors 3$j$ can also be integrated. The generator 2$j$ and the signal extractor 3$j$ are combined for a particular sampling rate $f_j$. All of the counters 6$j$ or all of the generators 2$j$ or all of the signal extractors 3$j$ may respectively be combined.

The invention makes it possible for the functionality of the signal extractor to be separated into a maximum of four elementary blocks and provides suitable and technically expedient arrangements at the top level of the signal extractor. It is possible to set up a trade-off between the performance and area of all the underlying circuit architectures.

Figure 8:
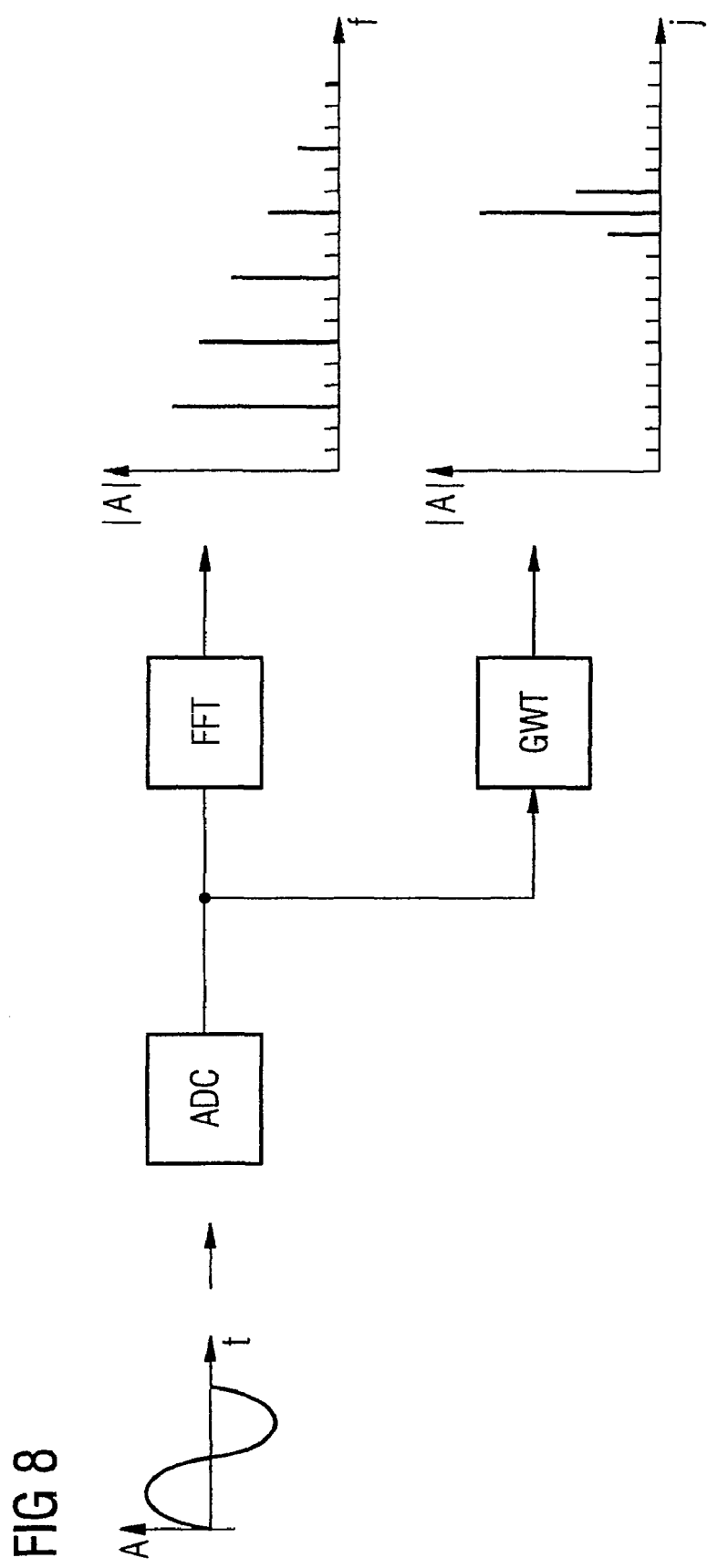
FIG. 8 shows a spectrum of the output signal from the test apparatus according to an embodiment in comparison with a frequency spectrum of a test response that is evaluated using an FFT.

FIG. 8 shows the frequency spectrum of a test response that is evaluated in two different ways. An analog signal which is shown by the sinusoidal curve is digitized using an analog/digital converter ADC. The digitized signal is evaluated, on the one hand, by means of an FFT and, on the other hand, by means of a test apparatus according to an embodiment. The graphs show the amplitudes of the respective spectral lines plotted against the frequency. There are frequency lines having large amplitudes during evaluation by means of the FFT. These frequency lines represent the spectral components of the test signal, while the spectral lines having small amplitudes represent the noise components which are generated, for example, by the FFT.

In the lower graph, the digital signal was evaluated by means of the test apparatus according to an embodiment, the evaluation being referred to as GWT (General Wavelet Transformation). In the graph, the amplitude is plotted against the different wavelets j which correspond to the reference signals $x_k, y_k, \ldots$. There are large amplitudes for three wavelets, while the amplitudes are either small or zero for the other wavelets. The test response of the ADC is described as a linear combination of wavelets.

FIG. 9 shows signal profiles of nodes of a test apparatus according to an embodiment. In this case, the upper graph indicates the values for a test response E. In this case, the signal values fluctuate between 0 and 32. The central graph shows the signal waveform S that is intended to be sought. The lower graph is a reference signal $x_k$ which is used to assess whether the signal S is in the test response E. The reference signal $x_k$ is only one reference signal from a set of reference signals. Assessing the reference signal and the test response E gives a value which indicates whether the reference signal is contained in the test response E.

This assessment determines whether the test response contains the reference signal. In this case, the scalar product is formed from part of the test response E and the reference signal $x_k$. A check is then carried out to determine whether the scalar product exceeds a particular value.

FIGS. 10A to 10F show another example of signal profiles for illustrating the method of operation of the test apparatus according to an embodiment.

Figure 10A:
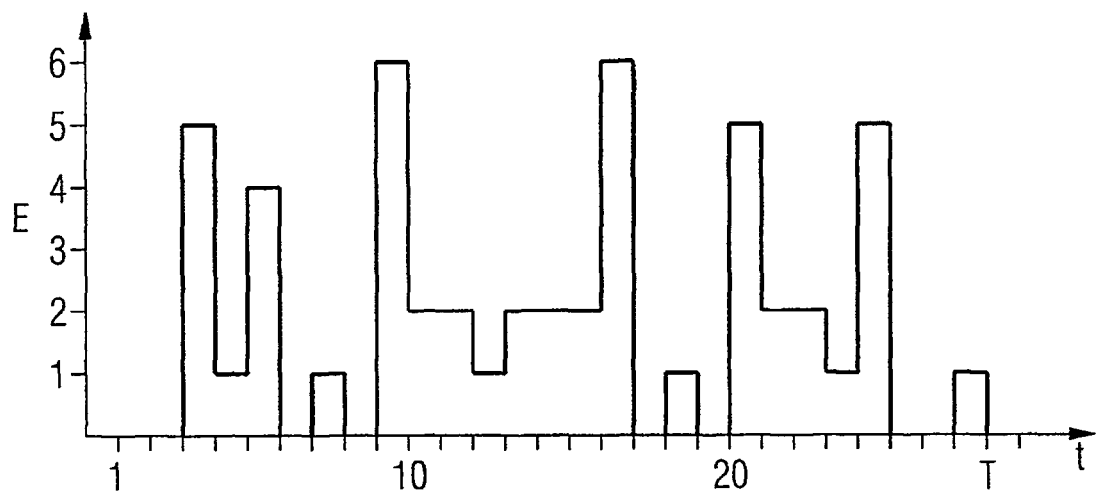
FIG. 10 shows, in another embodiment, signal profiles of signals within a test apparatus.

In this case, FIG. 10A shows the function values of the test response E plotted against time t. The function values are in the range between zero and six. The test response E can be developed into a complete orthogonal system of reference functions (wavelets) within a period T.

$$E = \Sigma a_i i_k = a_1 1_k + a_2 2_k + \ldots + a_x x_k + a_y y_k + a_z z_k + \ldots \quad (I)$$

In this case, the reference functions (wavelets) $i_k$ are selected in such a manner that the digital pattern P $$P = \sum_i b_i i_k$$

to be expected and tested is intended to be described by as few coefficients $b_i \neq 0$ and $b_i > \epsilon$ as possible.

Figure 10B:
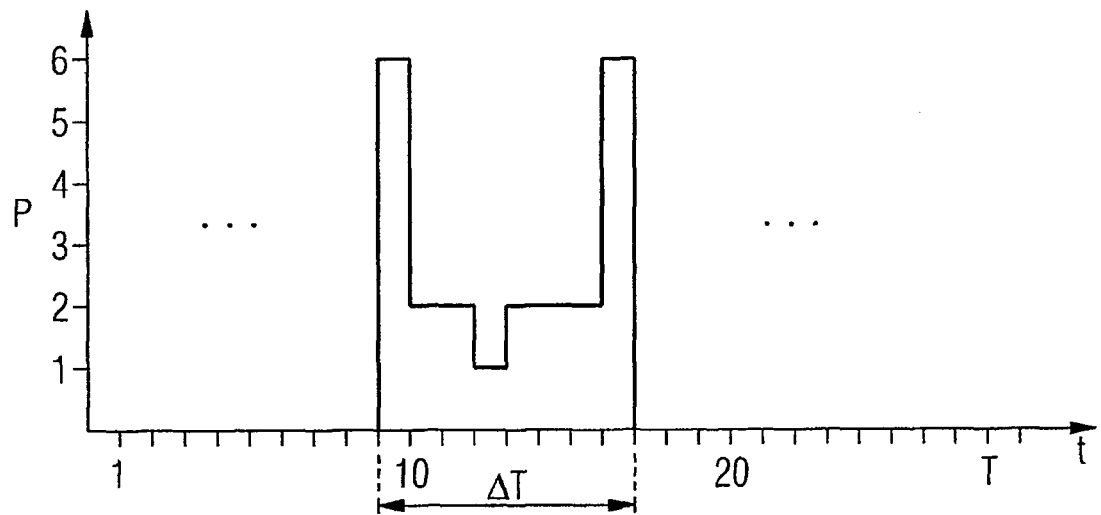
Figure 10C:
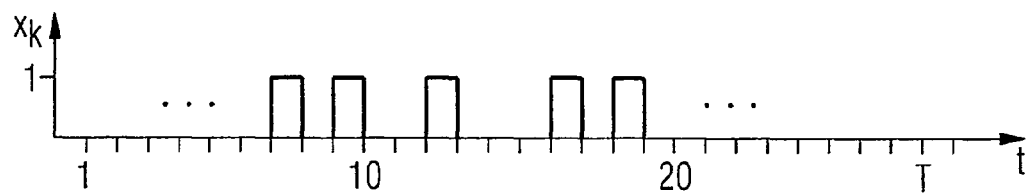
Figure 10D:
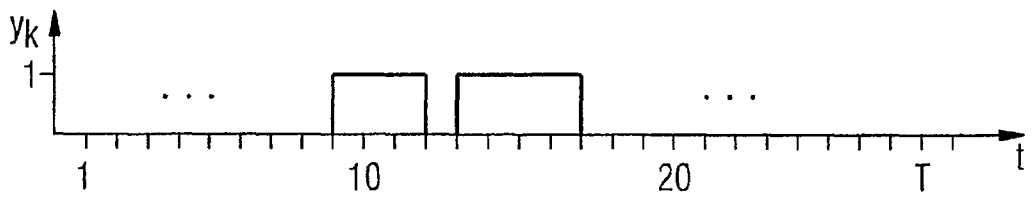
Figure 10E:
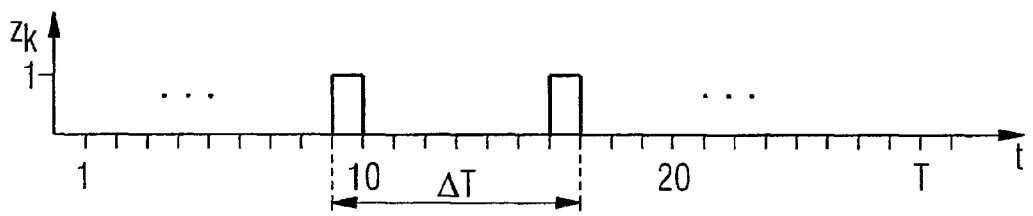
Figure 10F:
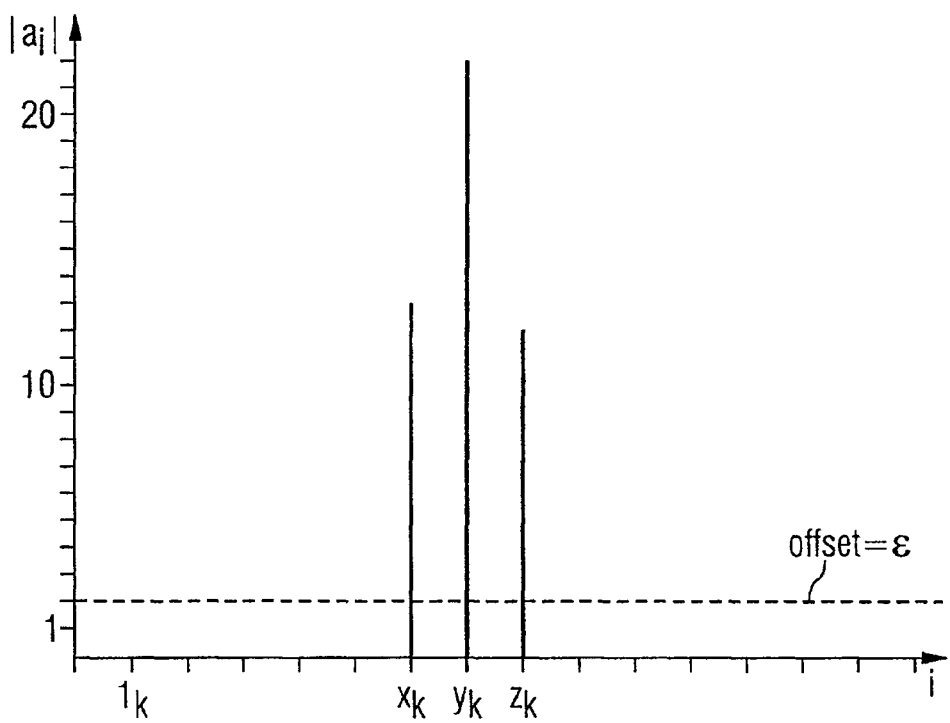

FIG. 10B shows such a sought pattern P, which is composed of the basic functions $x_k, y_k, z_k$, plotted against time t. $x_k, y_k, z_k$ are shown in FIGS. 10C, 10D and 10E. The following applies to the pattern P $$P = \sum_i b_i i_k = b_x x_k + b_y y_k + b_z z_k = x_k + 2y_k + 3z_k$$

$$\text{where} \int_{i \neq j} i_k j_k = 0$$

within the period T. It follows from (I) that $$\int E j_k = \int \left( \sum_i a_i i_k \right) j_k = \sum_i a_i \int i_k j_k$$

for orthonormalized functions $\int i_k j_k = 1$ for $j_k = i_k \Rightarrow \int_{E j_k} = a_j$ since the scalar products of two different reference functions are zero on account of their orthogonality. Within the period T, the following applies $a_i = \int E i_k \leq \epsilon$ for $i \neq x, y, z$ $a_x = \int E x_k \leq 6 + 1 + 6 + \epsilon = 13 + \epsilon$ $a_y = \int E y_k \leq 6 + 2 + 2 + 2 + 2 + 6 + \epsilon = 22 + \epsilon$ $a_z = \int E z_k \leq 6 + 6 + \epsilon = 12 + \epsilon$ In this case, $\epsilon$ is a limit beneath which the result values are not taken into consideration. For example, in the range outside $\Delta T$, there are summands which contribute to the sum $a_x$. However, this contribution is so small that it can be ignored. The pattern P can thus be detected in the test response E using the three reference functions (wavelets). The distribution of the wavelet coefficients $a_i$ is shown in FIG. 10F. The magnitude of the coefficients $a_i$ is plotted there against the wavelets i. The coefficients which are larger than the offset $\epsilon$ are the coefficients of the wavelets $x_k, y_k$ and $z_k$.

LIST OF REFERENCE SYMBOLS

1 Test apparatus
2 Generator
3 Signal extractor
4 Frequency divider
5, 51, 52 ..., 5$k$ Memory
50 Multimemory
6 Counter
7 Distributor network
8 Correction memory
81 Multicorrection block
9 Multiextractor block
10 Extraction block
11 Multiextractor
111, 112, ..., 11$k$ Extractor block
13 Extractor block
14 Extractor block

What is claimed is:

1. A test apparatus for testing digitized test responses output by a device in a test, comprising:
   a generator which uses direct digital synthesis to generate a set of n digital reference signals which are orthogonal to one another, n being a natural number greater than 1,
   a signal extractor which contains a test input and a plurality of reference inputs, the signal extractor being an element separate from the generator,
   wherein the test input receives a digitized test response output by the device in the test, which is a digital signal, and the reference inputs are connected to the reference signals which are generated by the generator,
   and wherein the signal extractor generates scalar products from a respective reference signal and the test response output by the device in the test and uses said products to calculate whether a combination of the reference signals is contained in the test response output by the device in the test.

2. The test apparatus according to claim 1, comprising a correction circuit which contains a correction memory and which corrects the reference signals using values which are stored in the correction memory.

3. The test apparatus according to claim 1, wherein the signal extractor has a test output at which the signal extractor outputs values for the phase, the offset and the amplitude,
   the amplitude describing whether the signal contained in the test response has expanded in comparison with the reference signal,
   the phase describing the extent to which the signal contained in the test response has been shifted, in terms of time, with respect to the reference signal, and
   the offset describing the extent to which the reference line of the test response has been shifted with respect to the reference line of the reference signal.

4. The test apparatus according to claim 1, wherein the generator receives a clock signal and uses the clock signal to read out values which are stored in the generator and outputs said values as the reference signals.

5. The test apparatus according to claim 1, further comprising:
   a multiplicity of generators which each generate a set of n orthogonal digital reference signals, and
   a multiplicity of signal extractors, each signal extractor receiving a set of the multiplicity of sets of reference signals at its reference input, receiving the digitized test response at its test input and generating scalar products from a respective reference signal and the test response and using said products to calculate whether the reference signals of the received set of reference signals are contained in the test response.

6. The test apparatus according to claim 1, comprising a frequency divider which receives an input clock and generates a multiplicity of clock signals whose clock periods are multiples of the periods of the input clock and outputs said signals to the multiplicity of generators.

7. The test apparatus according to claim 1, wherein the test apparatus is implemented in a Built-In Self-Test (BIST) or Built-Off Self-Test (BOST).

8. The test apparatus according to claim 1, wherein the number $n \leq 32$.

9. The test apparatus according to claim 4, wherein the generator has a counter which increases its counter reading upon each clock pulse, and wherein the stored values are correspondingly read out on the basis of the counter reading.

* * * * *